(12) United States Patent
Nishimaki et al.

(10) Patent No.: US 11,199,777 B2
(45) Date of Patent: Dec. 14, 2021

(54) RESIST UNDERLAYER FILM-FORMING COMPOSITION CONTAINING NOVOLAC POLYMER HAVING SECONDARY AMINO GROUP

(71) Applicant: NISSAN CHEMICAL INDUSTRIES, LTD., Tokyo (JP)

(72) Inventors: Hirokazu Nishimaki, Toyama (JP); Keisuke Hashimoto, Toyama (JP); Rikimaru Sakamoto, Toyama (JP); Takafumi Endo, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/108,350

(22) PCT Filed: Dec. 15, 2014

(86) PCT No.: PCT/JP2014/083130
§ 371 (c)(1),
(2) Date: Jun. 27, 2016

(87) PCT Pub. No.: WO2015/098594
PCT Pub. Date: Jul. 2, 2015

(65) Prior Publication Data
US 2016/0326396 A1 Nov. 10, 2016

(30) Foreign Application Priority Data
Dec. 26, 2013 (JP) .............................. JP2013-269765

(51) Int. Cl.
*G03F 7/09* (2006.01)
*G03F 7/11* (2006.01)
(Continued)

(52) U.S. Cl.
CPC .................. *G03F 7/11* (2013.01); *C08G 8/16* (2013.01); *C08G 12/08* (2013.01); *C09D 161/22* (2013.01);
(Continued)

(58) Field of Classification Search
CPC ......... C08G 12/08; C08G 8/16; G03F 7/0382; G03F 7/40; G03F 7/091; G03F 7/11
(Continued)

(56) References Cited

U.S. PATENT DOCUMENTS 7,378,217 B2    5/2008  Oh et al.
2016/0190111 A1*  6/2016  Oyu .................... H01L 25/0753
                                                    257/89

FOREIGN PATENT DOCUMENTS

JP    H02-293850 A    12/1990
JP    H04-268559 A     9/1992
(Continued)

OTHER PUBLICATIONS

Mar. 3, 2015 Search Report issued in International Patent Application No. PCT/JP2014/083130.
(Continued)

*Primary Examiner* — John S Chu
(74) *Attorney, Agent, or Firm* — Oliff PLC (57) ABSTRACT

A resist underlayer film which has an excellent hard mask function and can form an excellent pattern shape. A resist underlayer film-forming composition to be used for a lithography process, including a novolac polymer obtained by reaction of an aldehyde compound and an aromatic compound having a secondary amino group. The novolac polymer contains a unit structure of Formula (1):
(Continued)

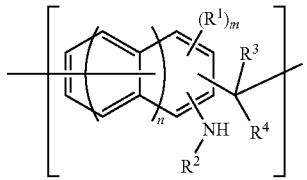

(1)

A method for producing a semiconductor device, including the steps of: forming a resist underlayer film from the resist underlayer film-forming composition on a semiconductor substrate; forming a hard mask on the resist underlayer film; further forming a resist film on the hard mask; forming a resist pattern by irradiation with light or an electron beam and development; etching the hard mask by using the formed resist pattern; etching the resist underlayer film by using the patterned hard mask; and processing the semiconductor substrate by using the patterned underlayer film.

10 Claims, 2 Drawing Sheets (51) Int. Cl.
| | | |
|---|---|---|
| G03F 7/20 | (2006.01) | |
| C08G 12/08 | (2006.01) | |
| C08G 8/16 | (2006.01) | |
| H01L 21/033 | (2006.01) | |
| C09D 161/22 | (2006.01) | |
| G03F 7/32 | (2006.01) | |
| H01L 21/308 | (2006.01) | |

(52) U.S. Cl.
CPC ............... *G03F 7/091* (2013.01); *G03F 7/20* (2013.01); *G03F 7/2059* (2013.01); *G03F 7/32* (2013.01); *H01L 21/0332* (2013.01); *H01L 21/3081* (2013.01)

(58) Field of Classification Search
USPC .................. 528/129, 149; 430/271.1, 326
See application file for complete search history.

(56) References Cited

FOREIGN PATENT DOCUMENTS

| JP | 2002-311569 A | 10/2002 |
|---|---|---|
| JP | 2004-198632 A | 7/2004 |
| JP | 2004-198812 A | 7/2004 |
| JP | 2007-178974 A | 7/2007 |
| JP | 2007-199653 A | 8/2007 |
| JP | 2015-018222 A | 1/2015 |
| WO | 2006/132088 A1 | 12/2006 |
| WO | 2010/147155 A1 | 12/2010 |
| WO | 2012/077640 A1 | 6/2012 |
| WO | 2013/047516 A1 | 4/2013 |
| WO | 2013/115097 A1 | 8/2013 |
| WO | 2013/146670 A1 | 10/2013 |

OTHER PUBLICATIONS

Mar. 3, 2015 Written Opinion of the Searching Authority issued in International Patent Application No. PCT/JP2014/083130.

\* cited by examiner

RESIST UNDERLAYER FILM-FORMING COMPOSITION CONTAINING NOVOLAC POLYMER HAVING SECONDARY AMINO GROUP

The present invention relates to a resist underlayer film-forming composition for lithography that is effective at the time of semiconductor substrate processing, a method for forming a resist pattern using the resist underlayer film-forming composition, and a method for producing a semiconductor device.

BACKGROUND ART

Conventionally, microfabrication has been carried out by lithography using a photoresist composition in the production of semiconductor devices. The microfabrication is a method for processing including forming a thin film of a photoresist composition on a substrate to be processed such as a silicon wafer, irradiating the thin film with active light such as ultraviolet rays through a mask pattern in which a pattern of a semiconductor device is depicted, developing the pattern, and etching the substrate to be processed such as a silicon wafer by using the obtained photoresist pattern as a protection film. In recent years, however, semiconductor devices have been further integrated, and the active light to be used has had a shorter wavelength from a KrF excimer laser (248 nm) to an ArF excimer laser (193 nm). This raises serious problems of the effects of diffused reflection of active light from the substrate and standing waves. Consequently, a method for providing a bottom anti-reflective coating (BARC) between a photoresist and a substrate to be processed has been widely studied.

When the formation of the finer resist pattern will be progressed in the future, the problem of resolution and the problem of resist pattern collapse after development will occur and thus formation of a thinner resist film will be desired. Consequently, the resist pattern thickness sufficient for substrate processing is difficult to secure. As a result, not only the resist pattern but also the resist underlayer film to be formed between the resist and the semiconductor substrate to be processed has been required to have the function as a mask at the time of the substrate processing. As the resist underlayer film for such a process, the resist underlayer film for lithography having the selectivity of dry etching rate close to that of the resist, the resist underlayer film for lithography having the selectivity of dry etching rate lower than that of the resist, or the resist underlayer film for lithography having the selectivity of dry etching rate lower than that of the semiconductor substrate, which is different from conventional high etching rate (etching rate is fast) resist underlayer films, has been required.

As the polymer for the resist underlayer film, the following polymers are exemplified.

A resist underlayer film-forming composition including polyvinyl carbazole has been exemplified (refer to Patent Document 1)

A resist underlayer film-forming composition including a resin having a unit structure of carbazole novolak and a unit structure of naphthalene novolak has been described (for example, refer to Patent Document 2).

A resist underlayer film-forming composition including a phenylnaphthylamine novolac resin has been described (for example, refer to Patent Document 3).

A resist underlayer film-forming composition including a naphthalene novolak resin has been described (for example, refer to Patent Document 4).

A resist underlayer film-forming composition including a fluorenenaphthol novolak resin has been described (for example, refer to Patent Document 5).

A resist underlayer film-forming composition including a resin comprising repeating units of a fluorene phenol and an arylalkylene has been described (for example, refer to Patent Document 6 and Patent Document 7).

PRIOR ART DOCUMENTS

Patent Documents

Patent Document 1: Japanese Patent Application Publication No. H2-293850 (JP H2-293850 A)

Patent Document 2: WO 2012/077640 Pamphlet

Patent Document 3: WO 2013/047516 Pamphlet

Patent Document 4: WO 2006/132088 Pamphlet

Patent Document 5: Japanese Patent Application Publication No. 2007-199653 (JP 2007-199653 A)

Patent Document 6: Japanese Patent Application Publication No. 2007-178974 (JP 2007-178974 A)

Patent Document 7: U.S. Pat. No. 7,378,217

SUMMARY OF THE INVENTION

Problem to be Solved by the Invention

An object of the present invention is to provide a resist underlayer film-forming composition for use in the lithography process of semiconductor device production. Another object of the present invention is to provide the resist underlayer film for lithography having the selectivity of dry etching rate close to that of the resist, the resist underlayer film for lithography having the selectivity of dry etching rate lower than that of the resist, or the resist underlayer film for lithography having the selectivity of dry etching rate lower than that of the semiconductor substrate, which does not cause intermixing with a resist layer and allow excellent resist patterns to be obtained. According to the present invention, a function of effectively absorbing reflected light from a substrate at the time of use of irradiation light having wavelength of 248 nm, 193 nm, 157 nm, or the like for microfabrication can be provided. Another object of the present invention is to provide a method for forming a resist pattern using the resist underlayer film-forming composition. Still another object of the present invention is to provide a resist underlayer film-forming composition for forming a resist underlayer film also having heat resistance.

Means for Solving the Problem

The present invention provides, as a first aspect, a resist underlayer film-forming composition used for a lithography process comprising a novolac polymer obtained by a reaction of an aldehyde compound and an aromatic compound having a secondary amino group, as a second aspect, the resist underlayer film-forming composition as described in the first aspect, in which the novolac polymer is a polymer containing a unit structure of Formula (1):

(1)

(in Formula (1), $R^1$ is a substituent of a hydrogen atom and is a halogen group, nitro group, amino group, hydroxy group, a $C_{1-10}$ alkyl group, a $C_{2-10}$ alkenyl group, a $C_{6-40}$ aryl group, or a combination of these groups optionally containing an ether bond, a ketone bond, or an ester bond; $R^2$ is a $C_{1-10}$ alkyl group, a $C_{2-10}$ alkenyl group, a $C_{6-40}$ aryl group, or a combination of these groups optionally containing an ether bond, a ketone bond, or an ester bond; $R^3$ is a hydrogen atom, or a $C_{6-40}$ aryl group or a heterocyclic group optionally having a substituent of a halogen group, nitro group, amino group, formyl group, carboxy group, carboxylic acid alkyl ester group, or hydroxy group; $R^4$ is a hydrogen atom, or a $C_{1-10}$ alkyl group, a $C_{6-40}$ aryl group, or a heterocyclic group optionally having a substituent of a halogen group, nitro group, amino group, formyl group, carboxy group, carboxylic acid alkyl ester group, or hydroxy group; $R^3$ and $R^4$ optionally form a ring together with carbon atoms bonded to $R^3$ and $R^4$; n is an integer of 0 or 1, and m is an integer of 0 to 3 when n is 0 and an integer of 0 to 5 when n is 1), as a third aspect, the resist underlayer film-forming composition as described in the second aspect, in which n and m are 0, and $R^2$ is methyl group or benzyl group, as a fourth aspect, the resist underlayer film-forming composition as described in the second aspect or the third aspect, in which $R^3$ is phenyl group, naphthyl group, anthryl group, or pyrenyl group, and $R^4$ is a hydrogen atom, as a fifth aspect, the resist underlayer film-forming composition as described in any one of the first aspect to the fourth aspect, further comprising a crosslinking agent, as a sixth aspect, the resist underlayer film-forming composition as described in any one of the first aspect to the fifth aspect, further comprising an acid and/or an acid generator, as a seventh aspect, a resist underlayer film obtained by applying the resist underlayer film-forming composition as described in any one of the first aspect to the sixth aspect onto a semiconductor substrate and baking the applied underlayer film-forming composition, as an eighth aspect, a method for producing a semiconductor device, the method comprising the steps of: forming an underlayer film from the resist underlayer film-forming composition as described in any one of the first aspect to the sixth aspect on a semiconductor substrate; forming a resist film on the underlayer film; forming a resist pattern by irradiation with light or an electron beam and development; etching the underlayer film by using the formed resist pattern; and processing the semiconductor substrate by using the patterned underlayer film, and as a ninth aspect, a method for producing a semiconductor device, the method comprising the steps of: forming a resist underlayer film from the resist underlayer film-forming composition as described in any one of the first aspect to the sixth aspect on a semiconductor substrate; forming a hard mask on the resist underlayer film; further forming a resist film on the hard mask; forming a resist pattern by irradiation with light or an electron beam and development; etching the hard mask by using the formed resist pattern; etching the resist underlayer film by using the patterned hard mask; and processing the semiconductor substrate by using the patterned underlayer film.

Effects of the Invention

Use of the resist underlayer film-forming composition of the present invention eliminates intermixing of the upper part of the resist underlayer film with a layer covering the resist underlayer film and allows the excellent pattern shapes of the resist film to be formed.

A function that effectively reduces reflection from the substrate can be provided for the resist underlayer film-forming composition of the present invention and thus the resist underlayer film also has an effect as an anti-reflective coating to exposed light.

Use of the resist underlayer film-forming composition of the present invention can provide the excellent resist underlayer film having the selectivity of dry etching rate close to that of the resist, the selectivity of dry etching rate lower than that of the resist, or the selectivity of dry etching rate lower than that of the semiconductor substrate.

In association with finer resist pattern formation, a thinner resist film is formed in order to prevent resist pattern collapse after development. For such a thin film resist, a process of transferring a resist pattern to the underlayer film of the resist by an etching process; and processing a substrate using the underlayer film as a mask, or a process of transferring a resist pattern to the underlayer film of the resist by an etching process; further transferring the transferred pattern of the underlayer film to the underlayer film of the patterned underlayer film using a different gas composition; repeating these processes; and finally processing the substrate is used. The resist underlayer film and the forming composition thereof of the present invention are effective for these processes and have sufficient etching resistance to the substrate to be processed (for example, a thermally oxidized silicon film, a silicon nitride film, and a polysilicon film on the substrate) at the time of processing the substrate using the resist underlayer films of the present invention.

The resist underlayer film for the present invention can be for use in a planarizing film, a resist underlayer film, a film for preventing contamination to the resist film, and a film having a dry etching selectivity. This allows the resist pattern formation in the lithography process of the semiconductor production to be easily and accurately carried out.

The processes of forming an underlayer film from the resist underlayer film-forming composition of the present invention onto a semiconductor substrate; forming a hard mask on the underlayer film; forming a resist film on the hard mask; forming a resist pattern by irradiation with light or an electron beam and development; transferring the resist pattern to the hard mask; transferring the resist pattern transferred to the hard mask to the resist underlayer film; and processing the semiconductor substrate by using the pattern-transferred underlayer film can be applied. The hard mask in this process is formed by an application type composition containing an organic polymer or an inorganic polymer and a solvent or formed by vapor deposition of an inorganic substance. In the vapor deposition of an inorganic substance (for example, silicon nitride oxide), a substance to be deposited is deposited on the surface of the resist underlayer film. At this time, the temperature of the of the resist underlayer film surface rises to around 400° C. In the present invention, the polymer to be used is a polymer containing a unit structure of Formula (1) and thus has extremely high heat resistance and does not cause thermal deterioration by the deposition of the substance to be deposited.

MODES FOR CARRYING OUT THE INVENTION

The present invention provides a resist underlayer film-forming composition to be used for a lithography process comprising a novolac resin obtained by a reaction of an aldehyde compound and an aromatic compound having a secondary amino group.

The present invention also provides a resist underlayer film-forming composition used for a lithography process comprising a novolac resin comprising a unit structure of Formula (1).

In the present invention, the resist underlayer film-forming composition for lithography contains the polymer and a solvent. The resist underlayer film-forming composition may contain a crosslinking agent and an acid, and may contain additives such as an acid generator, a surfactant, or the like, if necessary. The solid content of the composition is 0.1% by mass to 70% by mass or 0.1% by mass to 60% by mass. The solid content is a content ratio of the whole components of the resist underlayer film-forming composition from which the solvent is removed. In the solid content, the polymer can be added in a ratio of 1% by mass to 100% by mass, 1% by mass to 99.9% by mass, 50% by mass to 99.9% by mass, 50% by mass to 95% by mass, or 50% by mass to 90% by mass.

The polymer to be used in the present invention has a weight average molecular weight of 600 to 1,000,000 or 600 to 200,000.

In Formula (1), $R^1$ is a substituent of a hydrogen atom and is a halogen group, nitro group, amino group, hydroxy group, a $C_{1-10}$ alkyl group, a $C_{2-10}$ alkenyl group, a $C_{6-40}$ aryl group, or a combination of these groups optionally containing an ether bond, a ketone bond, or an ester bond; $R^2$ is a $C_{1-10}$ alkyl group, a $C_{2-10}$ alkenyl group, a $C_{6-40}$ aryl group, or a combination of these groups optionally containing an ether bond, a ketone bond, or an ester bond; $R^3$ is a hydrogen atom, or a $C_{6-40}$ aryl group or a heterocyclic group optionally having a substituent of a halogen group, nitro group, amino group, formyl group, carboxy group, carboxylic acid alkyl ester group, or hydroxy group; $R^4$ is a hydrogen atom, or a $C_{1-10}$ alkyl group, a $C_{6-40}$ aryl group, or a heterocyclic group optionally having a substituent of a halogen group, nitro group, amino group, formyl group, carboxy group, carboxylic acid alkyl ester group, or hydroxy group; $R^3$ and $R^4$ optionally form a ring together with carbon atoms bonded to $R^3$ and $R^4$. n is an integer of 0 or 1, and m is an integer of 0 to 3 when n is 0 and an integer of 0 to 5 when n is 1.

Examples of the $C_{1-10}$ alkyl group may include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

Examples of the $C_{2-10}$ alkenyl group may include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

Examples of $C_{6-40}$ aryl group may include phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, 9-phenanthryl group, and pyrenyl group.

As the heterocyclic group, an organic group made of a 5- to 6-membered heterocycle containing nitrogen, sulfur, or oxygen is preferable. Examples of the heterocyclic group may include pyrrole group, furan group, thiophene group, imidazole group, oxazole group, thiazole group, pyrazole group, isoxazole group, isothiazole group, and pyridine group.

Example of the $C_{6-40}$ aryl group optionally substituted with a hydroxy group may include phenol, dihydroxybenzene, trihydroxy benzene, naphthol, dihydroxynaphthalene, trihydroxynaphthalene, hydroxyanthracene, dihydroxyanthracene, and trihydroxyanthracene.

Examples of the alkyl group in the carboxylic acid alkyl ester group may include a $C_{1-10}$ alkyl group.

In Formula (1), the unit structure when n and m are 0 and $R^2$ is methyl group or benzyl group can be used. In Formula (1), an aralkyl group formed from a combination of the alkyl group and the aryl group can be selected as $R^2$. Examples of the aralkyl group may include benzyl group and phenethyl group.

The unit structure when $R^3$ is phenyl group, naphthyl group, anthryl group, or pyrenyl group and $R^4$ is a hydrogen atom can be used. Examples of the ring that $R^3$ and $R^4$ form together with carbon atoms bonded thereto may include a fluorene ring.

The novolac resin in the present invention is obtained by forming the unit structure of Formula (1) by the condensation reaction between an aromatic compound having a secondary amino group and aldehydes or ketones.

Examples of the aromatic compound having a secondary amino group include benzene derivatives and naphthalene derivatives and the aromatic compound can have the aforementioned substituent.

Examples of the aldehyde for use in polymer production of the present invention may include saturated aliphatic aldehydes such as formaldehyde, paraformaldehyde, acetaldehyde, propylaldehyde, butyraldehyde, isobutyraldehyde, valeraldehyde, capronaldehyde, 2-methylbutyraldehyde, hexylaldehyde, undecanealdehyde, 7-methoxy-3,7-dimethyloctylaldehyde, cyclohexanealdehyde, 3-methyl-2-butyraldehyde, glyoxal, malonaldehyde, succinaldehyde, glutaraldehyde, glutaraldehyde, and adipaldehyde, unsaturated aliphatic aldehydes such as acrolein and methacrolein, heterocyclic aldehydes such as furfural and pyridinealdehyde, and aromatic aldehydes such as benzaldehyde, naphthylaldehyde, anthrylaldehyde, phenanthrylaldehyde, salicylaldehyde, phenylacetaldehyde, 3-phenylpropionaldehyde, tolylaldehyde, (N,N-dimethylamino)benzaldehyde, acetoxybenzaldehyde, 1-pyrenecarboxaldehyde, anisaldehyde, and terephthalaldehyde. In particular, the aromatic aldehydes can be preferably used.

As the ketones for use in polymer production of the present invention, diaryl ketones are used. Example of the diaryl ketones may include diphenyl ketone, phenyl naphthyl ketone, dinaphthyl ketone, phenyl tolyl ketone, ditolyl ketone, and 9-fluorenone.

In this condensation reaction, the aldehydes or the ketones can be used in a ratio of 0.1 mol to 10 mol relative to 1 mol of the aromatic compound having a secondary amino group.

Examples of the usable acid catalyst to be used in the condensation reaction may include mineral acids such as sulfuric acid, phosphoric acid, and perchloric acid; organic sulfonic acids such as p-toluenesulfonic acid and p-toluenesulfonic acid monohydrate; and carboxylic acids such as formic acid and oxalic acid. The amount of the acid catalyst to be used is selected depending on the type of the acid to be used.

The amount of the acid catalyst is usually 0.001 parts by mass to 10,000 parts by mass, preferably 0.01 parts by mass to 1,000 parts by mass, and more preferably 0.1 parts by mass to 100 parts by mass relative to 100 parts by mass of the aromatic compound having a secondary amino group.

The condensation reaction may be carried out without solvent. The condensation reaction is, however, usually carried out with solvent. Any solvent can be used as long as the solvents do not inhibit the reaction. Examples of the solvent may include ring ethers such as tetrahydrofuran and dioxane. When the acid catalyst to be used is a liquid acid such as formic acid, the acid can also act as a solvent.

The reaction temperature at the time of condensation is usually 40° C. to 200° C. The reaction time is variously selected depending on the reaction temperature and usually about 30 minutes to about 50 hours.

The average molecular weight Mw of the polymer thus obtained is usually 500 to 1,000,000, or 600 to 200,000.

The polymer containing the unit structure of Formula (1) can be exemplified as the following Formulae (2-1) to (2-12) and Formulae (3-1) to (3-12).

Formula (2-1)

Formula (2-2)

Formula (2-3)

Formula (2-4)

Formula (2-5)

Formula (2-6)

Formula (2-7)

Formula (2-8)

Formula (2-9)

Formula (2-10)

Formula (2-11)

-continued

Formula (3-11)

Formula (3-12)

The polymer can be used by mixing with other polymers within 30% by mass to the total polymers.

Examples of the polymers may include polyacrylate compounds, polymethacrylate compounds, polyacrylamide compounds, polymethacrylamide compounds, polyvinyl compounds, polystyrene compounds, polymaleimide compound, polymaleic anhydrides, and polyacrylonitrile compounds.

Examples of the raw material monomer of the polyacrylate compounds may include methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, 4-hydroxybutyl acrylate, isobutyl acrylate, tert-butyl acrylate, cyclohexyl acrylate, isobornyl acrylate, 2-methoxyethyl acrylate, methoxy triethylene glycol acrylate, 2-ethoxyethyl acrylate, tetrahydrofurfuryl acrylate, 3-methoxybutyl acrylate, 2-methyl-2-adamantyl acrylate, 2-ethyl-2-adamantyl acrylate, 2-propyl 2-adamantyl acrylate, 2-methoxybutyl-2-adamantyl acrylate, 8-methyl-8-tricyclodecyl acrylate, 8-ethyl-8-tricyclodecyl acrylate, and 5-acryloyloxy-6-hydroxynorbornene-2-carboxylic-6-lactone.

Examples of the raw material monomer of the polymethacrylate compounds may include ethyl methacrylate, normal-propyl methacrylate, normal-pentyl methacrylate, cyclohexyl methacrylate, benzyl methacrylate, naphthyl methacrylate, anthryl methacrylate, anthrylmethyl methacrylate, phenyl methacrylate, 2-phenylethyl methacrylate, 2-hydroxyethyl methacrylate, 2-hydroxypropyl methacrylate, 2,2,2-trifluoroethyl methacrylate, 2,2,2-trichloroethyl methacrylate, methyl acrylate, isobutyl methacrylate, 2-ethylhexyl methacrylate, isodecyl methacrylate, normal-lauryl methacrylate, normal-stearyl methacrylate, methoxy diethylene glycol methacrylate, methoxy polyethylene glycol methacrylate, tetrahydrofurfuryl methacrylate, isobornyl methacrylate, tert-butyl methacrylate, isostearyl methacrylate, normal-butoxyethyl methacrylate, 3-chloro-2-hydroxypropyl methacrylate, 2-methyl-2-adamantyl methacrylate, 2-ethyl-2-adamantyl methacrylate, 2-propyl-2-adamantyl methacrylate, 2-methoxybutyl-2-adamantyl methacrylate, 8-methyl-8-tricyclodecyl methacrylate, 8-ethyl-8-tricyclodecyl methacrylate, 5-methacryloyloxy-6-hydroxynorbornene-2-carboxylic-6-lactone, and 2,2,3,3,4,4,4-heptafluorobutyl methacrylate.

Examples of the raw material monomer of the polyacrylamide compounds may include acrylamide, N-methylacrylamide, N-ethylacrylamide, N-benzylacrylamide, N-phenylacrylamide, and N,N-dimethylacrylamide.

Examples of the raw material monomer of the polymethacrylamide compounds may include methacrylamide, N-methylmethacrylamide, N-ethylmethacrylamide, N-benzylmethacrylamide, N-phenylmethacrylamide, and N,N-dimethylmethacrylamide.

Examples of the raw material monomer of the polyvinyl compounds may include, vinyl ether, methyl vinyl ether, benzyl vinyl ether, 2-hydroxyethyl vinyl ether, phenyl vinyl ether, and propyl vinyl ether.

Examples of the raw material monomer of the polystyrene compounds may include styrene, methylstyrene, chlorostyrene, bromostyrene, and hydroxystyrene.

Examples of the raw material monomer of the polymaleimide compounds may include maleimide, N-methylmaleimide, N-phenylmaleimide, and N-cyclohexylmaleimide.

These polymers can be produced by dissolving the addition-polymerizable monomer, and chain transfer agent (10% or less relative to the mass of the monomer) to be added if necessary, in an organic solvent, thereafter carrying out polymerization reaction by adding a polymerization initiator, and then adding a polymerization terminator. The amount of the polymerization initiator to be added is 1% by mass to 10% by mass and the amount of the polymerization terminator is 0.01% by mass to 0.2% by mass relative to the mass of the monomer. Examples of the organic solvent to be used may include propylene glycol monomethyl ether, propylene glycol monopropyl ether, ethyl lactate, cyclohexanone, methyl ethyl ketone, and dimethyl formamide. Examples of the chain transfer agent may include dodecanethiol and dodecylthiol. Examples of the polymerization initiator may include azobis-isobutyronitrile and azobis-cyclohexanecarbonitrile. Examples of the polymerization terminator may include 4-methoxyphenol. The reaction temperature is appropriately selected from 30° C. to 100° C. and the reaction time is appropriately selected from 1 hour to 48 hours.

The resist underlayer film-forming composition of the present invention may include a crosslinking agent component. Examples of the crosslinking agent may include a melamine-based agent, a substituted urea-based agent, or a polymer-based agent thereof. Preferably, the crosslinking agent has at least two crosslink-forming substituents. Examples of the crosslinking agent may include compounds such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or methoxymethylated thiourea. A condensate of these compounds can also be used.

As the crosslinking agent, a crosslinking agent having high heat resistance may be used. As the crosslinking agent having high heat resistance, a compound containing a crosslink-forming substituent having an aromatic ring (for example, a benzene ring or a naphthalene ring) in its molecule can preferably be used.

Examples of the compound may include a compound having a partial structure of Formula (4) and a polymer or an oligomer having a repeating unit of Formula (5).

Formula (4)

Formula (5)

In Formula (4), $R^{10}$ and $R''$ each are a hydrogen atom, a $C_{1-10}$ alkyl group, or a $C_{6-20}$ aryl group; n10 is an integer of 1 to 4; n11 is an integer of 1 to (5−n10); and (n10+n11) is an integer of 2 to 5.

In Formula (5), $R^{12}$ is a hydrogen atom or a $C_{1-10}$ alkyl group; $R^{13}$ is a $C_{1-10}$ alkyl group; n12 is an integer of 1 to 4; n13 is an integer of 0 to (4−n12); and (n12+n13) is an integer of 1 to 4. The oligomer and the polymer can be used in a range of the number of the repeating unit structure of 2 to 100 or in a range of 2 to 50.

As these alkyl group and aryl group, the alkyl group and the aryl group described above can be exemplified.

The compounds, the polymers, and the oligomers of Formula (4) and Formula (5) are exemplified as follows:

Formula (4-1)

Formula (4-2)

Formula (4-3)

Formula (4-4)

Formula (4-5)

Formula (4-6)

Formula (4-7)

Formula (4-8)

Formula (4-9)

Formula (4-10)

-continued

Formula (4-11)

Formula (4-12)

Formula (4-13)

Formula (4-14)

Formula (4-15)

Formula (4-16)

Formula (4-17)

Formula (4-18)

Formula (4-19)

Formula (4-20)

Formula (4-21)

Formula (4-22)

Formula (4-23)

Formula (4-24)

-continued

Formula (4-25)

Formula (4-26)

Formula (4-27)

The compounds can be obtained as commercial products manufactured by Asahi Organic Chemicals Industry Co., Ltd. or HONSHU CHEMICAL INDUSTRY CO., LTD. For example, among the crosslinking agent, the compound of Formula (4-21) can be obtained as TM-BIP-A (trade name, manufactured by Asahi Organic Chemicals Industry Co., Ltd.) and the compound of Formula (4-22) can be obtained as TMOM-BP (trade name, HONSHU CHEMICAL INDUSTRY CO., LTD.).

An amount of the crosslinking agents to be added varies depending on an application solvent to be used, a base substrate to be used, a required solution viscosity, a film shape to be required, and the like. The amount is 0.001% by mass to 80% by mass, preferably 0.01% by mass to 50% by mass, and further preferably 0.05% by mass to 40% by mass relative to the whole solid content. These crosslinking agents may cause a crosslinking reaction by self-condensation. The crosslinking agent can, however, cause a crosslinking reaction with a crosslinkable substituent when the crosslinkable substituent exists in the polymer of the present invention.

In the present invention, acidic compounds such as p-toluenesulfonic acid, trifluoromethanesulfonic acid, pyridinium p-toluenesulfonate, salicylic acid, sulfosalicylic acid, citric acid, benzoic acid, hydroxybenzoic acid, naphthalene carboxylic acid and/or thermal acid generators such as 2,4,4,6-tetrabromocyclohexadienone, benzoin tosylate, 2-nitrobenzyl tosylate, other organic sulfonic acid alkyl ester, and a quaternary ammonium salt of trifluoromethanesulfonic acid can be added as a catalyst for promoting the crosslinking reaction. The amount of the catalyst to be added is 0.0001% by mass to 20% by mass, preferably 0.0005% by mass to 10% by mass, and more preferably 0.01% by mass to 3% by mass relative to the whole solid content.

In order to match the acidity of the resist underlayer film-forming composition for lithography of the present invention to the acidity of the photoresist that covers the resist underlayer film in the lithography process as an upper layer, the underlayer film-forming composition for lithography of the present invention can contain a photoacid generator. Examples of the preferable photoacid generator may include onium salt photoacid generators such as bis(4-t-butylphenyl)iodonium trifluoromethanesulfonate and triphenylsulfonium trifluoromethanesulfonate; halogen-containing photoacid generators such as phenyl-bis(trichloromethyl)-s-triazine; and sulfonic acid photoacid generators such as benzoin tosylate and N-hydroxysuccinimide trifluoromethanesulfonate. The amount of the photoacid generator is 0.2% by mass to 10% by mass and preferably 0.4% by mass to 5% by mass relative to the whole solid content.

To the resist underlayer film material for lithography of the present invention, for example, a further light absorbent, a rheology modifier, an adhesion assistance agent, or a surfactant may be added in addition to the components described above if necessary.

As further light absorbents, for example, commercially available light absorbents described in "Kogyoyo Shikiso no Gijutu to Shijyo (Technology and Market of Industrial Colorant)" (CMC Publishing Co., Ltd) and "Senryo Binran (Dye Handbook)" (The Society of Synthetic Organic Chemistry, Japan) can be preferably used. Preferably usable examples of the commercially available light absorbents include C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2. The light absorbents are usually added in a ratio of 10% by mass or less, and preferably in a ratio of 5% by mass or less relative to the whole solid content of the resist underlayer film material for lithography.

The rheology modifier is added for the purpose of mainly improving flowability of the resist underlayer film-forming composition, and, particularly in a baking process, improving film thickness uniformity of the resist underlayer film and enhancing filling ability of the resist underlayer film-forming composition into inside of a hole. Specific examples of the rheology modifier may include phthalic acid derivatives such as dimethyl phthalate, diethyl phthalate, diisobutyl phthalate, dihexyl phthalate, and butylisodecyl phthalate, adipic acid derivatives such as di-normal-butyl adipate, diisobutyl adipate, diisooctyl adipate, and octyldecyl adipate, maleic acid derivatives such as di-normal-butylmaleate, diethyl maleate, and dinonyl maleate, oleic acid derivatives such as methyl oleate, butyl oleate, and tetrahydrofurfuryl oleate, and stearic acid derivatives such as normal-butyl stearate, and glyceryl stearate. These rheology modifiers are usually added in a ratio of less than 30% by mass relative to the whole solid content of the resist underlayer film material for lithography.

The adhesion assistance agent is mainly added such that adhesion between the substrate or the resist and the resist underlayer film-forming composition is improved and that the resist is not peeled, particularly in development. Specific examples of the adhesion assistance agent may include chlorosilanes such as trimethylchlorosilane, dimethylvinylchlorosilane, methyldiphenylchlorosilane, and chloromethyldimethylchlorosilane, alkoxysilanes such as trimethylmethoxysilane, dimethyldiethoxysilane, methyldimethoxysilane, dimethylvinylethoxysilane, diphenyldimethoxysilane, and phenyltriethoxysilane, silazanes such as hexamethyldisilazane, N,N'-bis(trimethylsilyl)urea, dimethyltrimethylsilylamine, and trimethylsilylimidazole, silanes such as vinyltrichlorosilane, γ-chloropropyltrimethoxysilane, γ-aminopropyltriethoxysilane, and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine, and urea compounds or thiourea compounds such as 1,1-dimethylurea and 1,3-dimethylurea. These adhesion assistance agents are usually added in a ratio less than 5% by mass, and preferably in a ratio of less than 2% by mass relative to the whole solid content of the resist underlayer film material for lithography.

To the resist underlayer film material for lithography of the present invention, a surfactant may be added for preventing generation of pinholes and striations and further improving applicability to surface unevenness. Examples of the surfactant may include nonionic surfactant such as polyoxyethylene alkyl ethers including polyoxyethylene lauryl ethers, polyoxyethylene stearyl ethers, polyoxyethylene cetyl ethers, and polyoxyethylene oleyl ethers; polyoxyethylene alkylallyl ethers including polyoxyethylene octylphenol ethers and polyoxyethylene nonylphenol ethers; polyoxyethylene-polyoxypropylene block copolymers; sorbitan fatty acid esters including sorbitan monolaurate, sorbitan monopalmitate, sorbitan monostearate, sorbitan monooleate, sorbitan trioleate, and sorbitan tristearate; and polyoxyethylene sorbitan fatty acid esters including polyoxyethylene sorbitan monolaurates, polyoxyethylene sorbitan monopalmitates, polyoxyethylene sorbitan monostearates, polyoxyethylene sorbitan trioleates, and polyoxyethylene sorbitan tristearates; fluorochemical surfactants such as EFTOP EF301, EF303, and EF352 (trade name, manufactured by Tochem Products), MEGAFAC F171, F173, R-30, R-30N, and R-40LM (trade name, manufactured by Dainippon Ink and Chemicals Inc.), Fluorad FC430 and FC431 (trade name, manufactured by Sumitomo 3M Ltd.), Asahi guard AG710, Surflon S-382, SC101, SC102, SC103, SC104, SC105, and SC106 (trade name, manufactured by Asahi Glass Co., Ltd.); and Organosiloxane Polymer KP341 (manufactured by Shin-Etsu Chemical Co., Ltd.). The amount of the surfactant to be added is usually 2.0% by mass or less and preferably 1.0% by mass or less relative to the whole solid content of the resist underlayer film material for lithography of the present invention. These surfactants can be added singly or in combination of two or more of them.

In the present invention, usable examples of a solvent dissolving the polymer, the crosslinking agent component, the crosslinking catalyst, and the like may include ethylene glycol monomethyl ether, ethylene glycol monoethyl ether, ethylene glycol monobutyl ether, ethylene glycol monoisopropyl ether, ethylene glycol methyl ether acetate, ethylene glycol ethyl ether acetate, methylcellosolve acetate, ethylcellosolve acetate, diethylene glycol, diethylene glycol monomethyl ether, diethylene glycol monoethyl ether, diethylene glycol dimethyl ether, diethylene glycol diethyl ether, diethylene glycol monoethyl ether acetate, propylene glycol, propylene glycol monomethyl ether, propylene glycol monobutyl ether, propylene glycol monomethyl ether acetate, propylene glycol monoethyl ether, propylene glycol monoethyl ether acetate, propylene glycol propyl ether acetate, dipropylene glycol monomethyl ether, dipropylene glycol monoethyl ether, triethylene glycol dimethyl ether, toluene, xylene, styrene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxpropionate, ethyl 3-ethoxypropionate, methyl 3-ethoxypropionate, methyl pyruvate, ethyl pyruvate, ethyl acetate, butyl acetate, ethyl lactate, butyl lactate, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl isopropyl ketone, diethyl ketone, methyl isobutyl ketone, methyl normal-butyl ketone, isopropyl acetate ketone, normal-propyl acetate, isobutyl acetate, methanol, ethanol, isopropanol (2-propanol), tert-butanol, allyl alcohol, normal-propanol, 2-methyl-2-butanol, isobutanol, normal-butanol, 2-methyl-1-butanol, 1-pentanol, 2-methyl-1-pentanol, 2-ethylhexanol, 1-octanol, ethylene glycol, hexylene glycol, trimethylene glycol, 1-methoxy-2-butanol, diacetone alcohol, furfuryl alcohol, tetrahydrofurfuryl alcohol, propylene glycol, benzyl alcohol, isopropyl ether, 1,4-dioxane, N,N-dimethylformamide, N,N-dimethylacetamide, N-methylpyrrolidone, 1,3-dimethyl-2-imidazolidinone, dimethyl sulfoxide, and N-cyclohexyl-2-pyrrolidinone. These solvents can be used singly or in combination of two or more of them.

In addition, these solvents can be used by mixing with a high boiling point solvent such as propylene glycol monobutyl ether and propylene glycol monobutyl ether acetate. Among these solvents, propylene glycol monomethyl ether, propylene glycol monomethyl ether acetate, propylene glycol monobutyl ether, ethyl lactate, butyl lactate, and cyclohexanone are preferable for improved levering properties.

The resist used in the present invention is a photoresist or an electron beam resist.

As the photoresist to be applied on the resist underlayer film for lithography of the present invention, both negative photoresist and positive photoresist can be used. Examples of the resists include a positive photoresist made of a novolac resin and 1,2-naphthoquinonediazidesulfonate, a chemically amplified photoresist made of a binder having a group that increases an alkali dissolution rate by decomposing with an acid and a photoacid generator, a chemically amplified photoresist made of an alkali-soluble binder, a low molecular weight compound that increases an alkali dissolution rate of the photoresist by decomposing with an acid, and a photoacid generator, a chemically amplified photoresist made of a binder having a group that increases an alkali dissolution rate by decomposing with an acid, a low molecular weight compound that increases an alkali dissolution rate of the photoresist by decomposing with an acid, and a photoacid generator, and a photoresist having Si atoms in the skeleton of the molecule. Specific examples may include APEX-E (trade name, manufactured by Rohm and Haas Inc.)

Examples of the electron beam resist applied onto the resist underlayer film for lithography of the present invention may include a composition made of a resin containing Si—Si bonds in the main chain and containing an aromatic ring at its end and an acid generator generating an acid by irradiation with electron beams and a composition made of poly(p-hydroxystyrene) in which a hydroxy group is substituted with an organic group containing N-carboxyamine and an acid generator generating an acid by irradiation with electron beams. In the latter electron beam resist composition, the acid generated from the acid generator by the electron beam irradiation is reacted with N-carboxyaminoxy group of the polymer side chain and the polymer side chain is decomposed into hydroxy group to exhibit alkali solubility. Consequently, the resist composition is dissolved into an alkali development liquid to form a resist pattern. Examples of the acid generator generating the acid by electron beam irradiation may include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine, onium salts such as triphenylsulfonium salts and diphenyliodonium salts, and sulfonates such as nitrobenzyltosylate and dinitrobenzyltosylate.

As the development liquid for the resist having the resist underlayer film formed by using the resist underlayer film material for lithography of the present invention, the following aqueous alkali solutions can be used. The aqueous alkali solutions include solutions of inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcoholamines such as dimethylethanolamine and triethanolamine; quaternary ammonium salts such as tetramethylammonium hydroxide, tetraethylammonium hydroxide, and choline; and cyclic amines such as pyrrole and piperidine. To the aqueous solutions of the alkalis described above, an adequate amount of alcohols such as isopropyl alcohol or a surfactant such as a nonionic surfactant can be added and the mixture can be used. Among these development liquids, aqueous solutions of the quaternary ammonium salts are preferable and aqueous solutions of tetramethylammonium hydroxide and choline are further preferable.

Subsequently, a method for forming the resist pattern of the present invention will be described. The resist underlayer film-forming composition is applied onto a substrate (for example, silicon/silicon dioxide coating, a glass substrate and a transparent substrate such as an ITO substrate) for use in producing precision integrated circuit elements by an appropriate application method such as a spinner and a coater and thereafter the applied composition is cured by baking to form an application type underlayer film. A film thickness of the resist underlayer film is preferably 0.01 μm to 3.0 μm. Conditions for baking after the application are 80° C. to 350° C. for 0.5 minutes to 120 minutes. Thereafter, the resist is directly applied onto the resist underlayer film or applied after forming a film made of one layer or several layers of coating material on the application type underlayer film if necessary. Thereafter, the resist is irradiated with light or electron beams through the predetermined mask and is developed, rinsed, and dried to be able to obtain an excellent resist pattern. Post Exposure Bake (PEB) of light or electron beams can also be carried out if necessary. The part of the resist underlayer film where the resist is developed and removed by the previous process is removed by dry etching to be able to form a desired pattern on the substrate.

The exposure light of the photoresist is actinic rays such as near ultraviolet rays, far ultraviolet rays, or extreme ultraviolet rays (for example, EUV, wavelength 13.5 nm) and, for example, light having a wavelength of 248 nm (KrF laser light), 193 nm (ArF laser light), or 157 nm ($F_2$ laser light) is used. Any light irradiation method can be used without limitation as long as the acid can be generated from the photoacid generator. An exposure amount is 1 $mJ/cm^2$ to 2,000 $mJ/cm^2$, or 10 $mJ/cm^2$ to 1,500 $mJ/cm^2$, or 50 $mJ/cm^2$ to 1,000 $mJ/cm^2$.

The electron beam irradiation to the electron beam resist can be carried out by, for example, using an electron beam irradiation device.

In the present invention, a semiconductor device can be produced through the steps of forming a resist underlayer film by using the resist underlayer film-forming composition of the present invention onto a semiconductor substrate; forming a resist film on the underlayer film; forming a resist pattern by irradiation with light or electron beams and development; etching the resist underlayer film by using the formed resist pattern; and processing the semiconductor substrate by using the patterned resist underlayer film.

When the formation of the finer resist pattern will be progressed in the future, the problem of resolution and the problem of resist pattern collapse after development will occur and thus formation of a thinner resist film will be desired. Consequently, the resist pattern thickness sufficient for substrate processing is difficult to be secured. As a result, not only the resist pattern but also the resist underlayer film formed between the resist and the semiconductor substrate to be processed has been required to have the function as a mask at the time of the substrate processing. As the resist underlayer film for such a process, a resist underlayer film for lithography having the selectivity of dry etching rate close to that of the resist, a resist underlayer film for lithography having the selectivity of dry etching rate smaller than that of the resist, or a resist underlayer film for lithography having the selectivity of dry etching rate smaller than that of the semiconductor substrate, which is different from conventional resist underlayer films having high etch rate properties, has been required. Such a resist underlayer film can be provided with the function of anti-reflective properties and thus can also have the function of an anti-reflective coating.

On the other hand, in order to obtain a finer resist pattern, a process has been also started to be used in which the resist pattern and the resist underlayer film at the time of resist underlayer film dry etching are formed more narrowly than the pattern width at the time of resist development. As the resist underlayer film for such a process, the resist underlayer film having the selectivity of dry etching rate close to that of the resist, which is different from conventional high etching rate anti-reflective coatings, has been required. Such a resist underlayer film can be provided with the anti-reflective properties and thus can also have the function of the conventional anti-reflective coating In the present invention, after the resist underlayer film of the present invention is formed onto the substrate, the resist can be applied directly onto the resist underlayer film or after a film made of a single layer or several layers of coating material is formed onto the resist underlayer film. This enables the pattern width of the resist to be narrow. Even when the resist is thinly covered in order to prevent pattern collapse, the substrate can be processed by selecting an appropriate etching gas.

More specifically, the semiconductor device can be manufactured through the steps of: forming a resist underlayer film onto a semiconductor substrate using the resist underlayer film-forming composition of the present invention; forming a hard mask on the resist underlayer film using a coating material containing a silicon component and the like or a hard mask (for example, silicon nitride oxide) by vapor deposition; forming a resist film on the hard mask; forming a resist pattern by irradiation with light or an electron beam and development; etching the hard mask using the formed resist pattern with a halogen-based gas; etching the resist underlayer film using the patterned hard mask with an oxygen-based gas or a hydrogen-based gas; and processing the semiconductor substrate using the patterned resist underlayer film with the halogen-based gas.

In consideration of the effect as the anti-reflective coating, the resist underlayer film-forming composition for lithography of the present invention includes a light absorption site in the skeleton and thus no substances are diffused into the photoresist at the time of drying by heating. The light absorption site has sufficiently large light absorption properties and thus has a high anti-reflection effect.

The resist underlayer film-forming composition for lithography of the present invention has high heat stability, prevents contamination to the upper layer film caused by decomposed substances generated at the time of baking, and can provide an extra temperature margin during the baking process.

Depending on process conditions, the resist underlayer film material for lithography of the present invention can be used as a film that has the anti-reflection function and further has a function that prevents interaction between the substrate and the photoresist or prevents adverse effect on the substrate due to the materials for use in the photoresist or substances to be generated at the time of light exposure to the photoresist.

EXAMPLES

Synthesis Example 1

Into a 100 mL four-necked flask, N-methylaniline (4.50 g, 0.042 mol, manufactured by Tokyo Chemical Industry Co., Ltd.), 1-naphthaldehyde (6.56 g, 0.042 mol, manufactured by Tokyo Chemical Industry Co., Ltd.), methanesulfonic acid (1.21 g, 0.0126 mol, manufactured by KANTO CHEMICAL CO., INC.) were placed and propylene glycol monomethyl ether (18.41 g, manufactured by KANTO CHEMICAL CO., INC.) was charged, followed by stirring the resultant mixture. The mixture was heated to 120° C. to dissolve and polymerization was started. After 30 hours, the mixture was left to cool down to room temperature and reprecipitated in methanol (800 g, manufactured by KANTO CHEMICAL CO., INC.). The obtained precipitate was filtered and the filtered residue was dried under reduced pressure at 80° C. for 10 hours to give 4.2 g of a target polymer (Formula (2-2), hereinafter abbreviated to PMA-NA).

The weight average molecular weight Mw and the degree of distribution Mw/Mn of PMA-NA measured by GPC in terms of polystyrene were 1,800 and 1.48, respectively.

Synthesis Example 2

Into a 100 mL four-necked flask, N-methylaniline (3.50 g, 0.033 mol, manufactured by Tokyo Chemical Industry Co., Ltd.), 1-pyrenecarboxaldehyde (7.52 g, 0.033 mol, manufactured by Tokyo Chemical Industry Co., Ltd.), methanesulfonic acid (0.94 g, 0.0098 mol, manufactured by KANTO CHEMICAL CO., INC.) were placed and propylene glycol monomethyl ether (17.95 g, manufactured by KANTO CHEMICAL CO., INC.) was charged, followed by stirring the resultant mixture. The mixture was heated to 120° C. to dissolve and polymerization was started. After 30 hours, the mixture was left to cool down to room temperature and reprecipitated in methanol (800 g, manufactured by KANTO CHEMICAL CO., INC.). The obtained precipitate was filtered and the filtered residue was dried under reduced pressure at 80° C. for 10 hours to give 7.6 g of a target polymer (Formula (2-7), hereinafter abbreviated to PMA-PcA).

The weight average molecular weight Mw and the degree of distribution Mw/Mn of PMA-PcA measured by GPC in terms of polystyrene were 1,100 and 1.43, respectively.

Synthesis Example 3

Into a 100 mL four-necked flask, N-benzylaniline (8.00 g, 0.044 mol, manufactured by Tokyo Chemical Industry Co., Ltd.), 1-naphthaldehyde (6.82 g, 0.044 mol, manufactured by Tokyo Chemical Industry Co., Ltd.), methanesulfonic acid (1.26 g, 0.0131 mol, manufactured by KANTO CHEMICAL CO., INC.) were placed and propylene glycol monomethyl ether acetate (24.12 g, manufactured by KANTO CHEMICAL CO., INC.) was charged, followed by stirring the resultant mixture. The mixture was heated to 120° C. to dissolve and polymerization was started. After 30 hours, the mixture was left to cool down to room temperature and reprecipitated in methanol (800 g, manufactured by KANTO CHEMICAL CO., INC.). The obtained precipitate was filtered and the filtered residue was dried under reduced pressure at 80° C. for 10 hours to give 6.8 g of a target polymer (Formula (3-2), hereinafter abbreviated to PPBA-NA).

The weight average molecular weight Mw and the degree of distribution Mw/Mn of PPBA-NA measured by GPC in terms of polystyrene were 1,400 and 1.25, respectively.

Synthesis Example 4

Into a 100 mL four-necked flask, N-benzylaniline (8.00 g, 0.044 mol, manufactured by Tokyo Chemical Industry Co., Ltd.), 1-pyrenecarboxaldehyde (10.05 g, 0.044 mol, manufactured by Tokyo Chemical Industry Co., Ltd.), methanesulfonic acid (1.26 g, 0.0131 mol, manufactured by KANTO CHEMICAL CO., INC.) were placed and propylene glycol monomethyl ether acetate (28.97 g, manufactured by KANTO CHEMICAL CO., INC.) was charged, followed by stirring the resultant mixture. The mixture was heated to 120° C. to dissolve and polymerization was started. After 30 hours, the mixture was left to cool down to room temperature and reprecipitated in methanol (800 g, manufactured by KANTO CHEMICAL CO., INC.). The obtained precipitate was filtered and the filtered residue was dried under reduced pressure at 80° C. for 10 hours to give 10.8 g of a target polymer (Formula (3-7), hereinafter abbreviated to PPBA-PcA).

The weight average molecular weight Mw and the degree of distribution Mw/Mn of PPBA-PcA measured by GPC in terms of polystyrene were 1,300 and 1.25, respectively.

Comparative Synthesis Example 1

Under nitrogen atmosphere, into a 100 mL four-necked flask, carbazole (6.69 g, 0.040 mol, manufactured by Tokyo Chemical Industry Co., Ltd.), 9-fluorenone (7.28 g, 0.040 mol, manufactured by Tokyo Chemical Industry Co., Ltd.), p-toluenesulfonic acid monohydrate (0.76 g, 0.0040 mol, manufactured by Tokyo Chemical Industry Co., Ltd.) were placed and 1,4-dioxane (6.69 g, manufactured by KANTO CHEMICAL CO., INC.) was charged, followed by stirring the resultant mixture. The mixture was heated to 100° C. to dissolve and polymerization was started. After 24 hours, the mixture was left to cool down to 60° C., diluted with chloroform (34 g, manufactured by KANTO CHEMICAL CO., INC.), and reprecipitated in methanol (168 g, manufactured by KANTO CHEMICAL CO., INC.). The obtained precipitate was filtered and the filtered residue was dried under reduced pressure at 80° C. for 24 hours to give 9.37 g of a target polymer (Formula (6-1), hereinafter abbreviated to PCzFL).

The weight average molecular weight Mw and the degree of distribution Mw/Mn of PCzFL measured by GPC in terms of polystyrene were 2,800 and 1.77, respectively.

Formula (6-1)

Example 1

With 2 g of the resin obtained in Synthesis Example 1, 0.006 g of MEGAFAC R-30 (trade name, manufactured by Dainippon Ink and Chemicals Inc.) as a surfactant was mixed and the mixture was dissolved into 8 g of cyclohexanone to prepare a solution. Thereafter, the solution was filtered with a polyethylene microfilter having a pore diameter of 0.10 μm and then further filtered with a polyethylene microfilter having a pore diameter of 0.05 μm to prepare the solution of a resist underlayer film-forming composition for use in a lithography process by a multilayer film.

Example 2

With 2 g of the resin obtained in Synthesis Example 2, 0.006 g of MEGAFAC R-30 (trade name, manufactured by Dainippon Ink and Chemicals Inc.) as a surfactant was mixed and the mixture was dissolved into 8 g of cyclohexanone to prepare a solution. Thereafter, the solution was filtered with a polyethylene microfilter having a pore diameter of 0.10 μm and then further filtered with a polyethylene microfilter having a pore diameter of 0.05 μm to prepare the solution of a resist underlayer film-forming composition for use in a lithography process by a multilayer film.

Example 3

With 2 g of the resin obtained in Synthesis Example 3, 0.006 g of MEGAFAC R-30 (trade name, manufactured by Dainippon Ink and Chemicals Inc.) as a surfactant was mixed and the mixture was dissolved into 8 g of propylene glycol monomethyl ether acetate to prepare a solution. Thereafter, the solution was filtered with a polyethylene microfilter having a pore diameter of 0.10 μM and then further filtered with a polyethylene microfilter having a pore diameter of 0.05 μm to prepare the solution of a resist underlayer film-forming composition for use in a lithography process by a multilayer film.

Example 4

With 2 g of the resin obtained in Synthesis Example 4, 0.006 g of MEGAFAC R-30 (trade name, manufactured by Dainippon Ink and Chemicals Inc.) as a surfactant was mixed and the mixture was dissolved into 8 g of cyclohexanone to prepare a solution. Thereafter, the solution was filtered with a polyethylene microfilter having a pore diameter of 0.10 μm and then further filtered with a polyethylene microfilter having a pore diameter of 0.05 μm to prepare the solution of a resist underlayer film-forming composition for use in a lithography process by a multilayer film.

Comparative Example 1

With 2 g of a commercially available cresol novolac resin (a novolac resin obtained by using cresol and formaldehyde), 0.006 g of MEGAFAC R-30 (trade name, manufactured by Dainippon Ink and Chemicals Inc.) as a surfactant was mixed and the mixture was dissolved into 8 g of propylene glycol monomethyl ether acetate to prepare a solution. Thereafter, the solution was filtered with a polyethylene microfilter having a pore diameter of 0.10 μm and then further filtered with a polyethylene microfilter having a pore diameter of 0.05 μm to prepare the solution of a resist underlayer film-forming composition for use in a lithography process by a multilayer film.

Comparative Example 2

With 2 g of the resin obtained in Comparative Synthesis Example 1, 0.006 g of MEGAFAC R-30 (trade name, manufactured by Dainippon Ink and Chemicals Inc.) as a surfactant was mixed and the mixture was dissolved into 8 g of propylene glycol monomethyl ether acetate to prepare a solution. Thereafter, the solution was filtered with a polyethylene microfilter having a pore diameter of 0.10 μm and then further filtered with a polyethylene microfilter having a pore diameter of 0.05 μm to prepare the solution of a resist underlayer film-forming composition for use in a lithography process by a multilayer film.

(Elution Test to Photoresist Solvent)

Each of the resist underlayer film-forming composition solutions prepared in Examples 1 to 4 and Comparative Example 1 was applied onto a silicon wafer with a spin coater. The applied composition solution was baked on a hot plate at 400° C. for 2 minutes to form a resist underlayer film (film thickness 0.30 μm). These resist underlayer films were immersed into solvents for use in the resist, for example, ethyl lactate, propylene glycol monomethyl ether, propylene glycol monomethyl ether acetate, and cyclohexanone. It was confirmed that the resist underlayer films were insoluble to these solvents.

(Measurement of Dry Etching Rate)

The following etcher and etching gas were for use in dry etching rate measurement. ES401 (manufactured by Nippon Scientific Co., Ltd.): $CF_4$ Each of the resist underlayer film-forming composition solutions prepared in Examples 1 to 4 and Comparative Example 1 was applied onto a silicon wafer with a spin coater. The applied composition solution was baked on a hot plate at 240° C. for 1 minute or 400° C. for 2 minutes to form a resist underlayer film (film thickness 0.30 μm). The dry etching rate was measured using $CF_4$ gas as the etching gas.

Similarly, the solution of a phenol novolac resin (commercially available, the weight average molecular weight Mw and the degree of distribution Mw/Mn measured by GPC in terms of polystyrene were 2,000 and 2.5, respectively) was applied onto a silicon wafer with a spin coater. The applied composition solution was baked at 205° C. for 1 minute to form a coating film. The dry etching rate was measured using $CF_4$ gas as the etching gas. The dry etching rates of the resist underlayer films of Examples 1 to 4 and Comparative Example 1 were compared when the etching rate of the phenol novolac resin film (film thickness 0.2 μm) was determined to be 1.00. The results were listed in Table 1. The rate ratio is the ratio of (the dry etching rate of resist underlayer film)/(the dry etching rate of phenol-novolac resin film).

TABLE 1

| | Dry etching rate ratio | |
| --- | --- | --- |
| | Rate ratio of film baked at 240° C. | Rate ratio of film baked at 400° C. |
| Example 1 | 0.80 | 0.79 |
| Example 2 | 0.79 | 0.73 |
| Example 3 | 0.79 | 0.76 |
| Example 4 | 0.81 | 0.73 |
| Comparative Example 1 | 1.00 | 1.15 |

(Test of Embeddability to Hole Wafer)

Each of the resist underlayer film-forming composition solutions prepared in Examples 1 to 4 and Comparative Example 2 was applied onto a hole wafer with a spin coater. The applied composition solution was baked on a hot plate at 400° C. for 2 minutes to form a resist underlayer film (film thickness 0.25 μm). As the hole wafer, a wafer having a hole pattern of a diameter of 100 nm and a height of 400 nm was used.

The resist underlayer film-forming composition solutions prepared in Examples 1 to 4 were applied onto the hole wafer with a spin coater and the applied composition solutions were baked on a hot plate at 400° C. for 2 minutes. Thereafter, the substrate was cut. From the photographs of FIG. 1 to FIG. 4 observed with an electron microscope, it is found that the composition solutions were sufficiently filled inside the holes.

Figure 1:
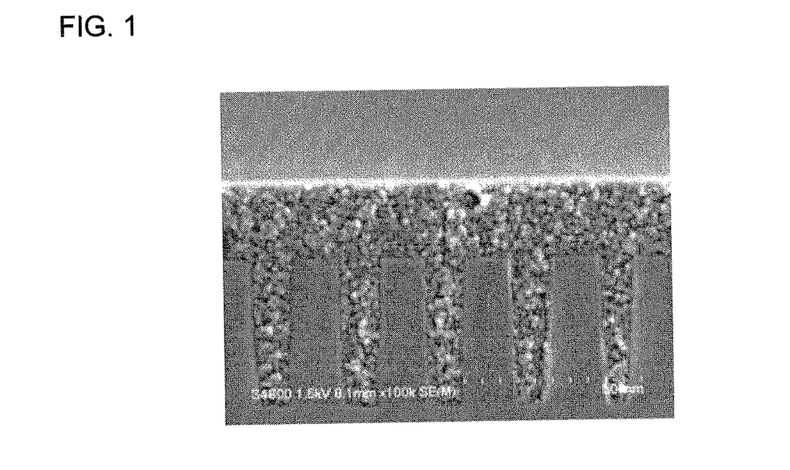
FIG. 1 is a photograph observing with an electron microscope the section of a substrate after applying a resist underlayer film-forming composition solution prepared in Example 1 onto a hole wafer with a spin coater and baking the applied composition solution at 400° C. for two minutes (the magnification is 100,000 times).
Figure 2:
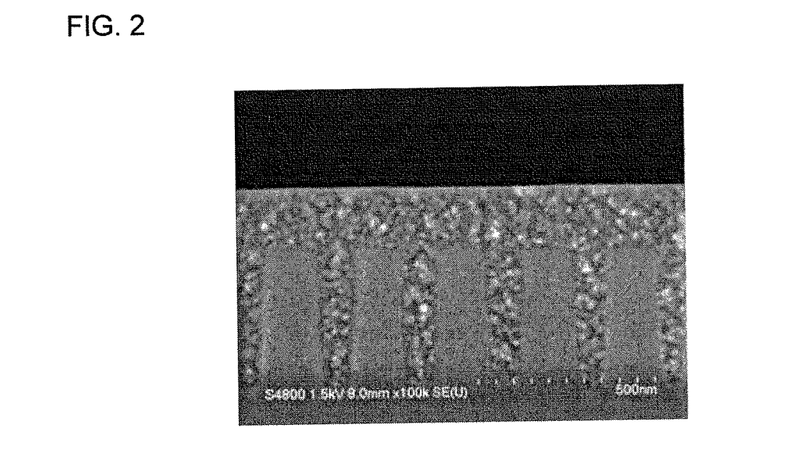
FIG. 2 is a photograph observing with an electron microscope the section of a substrate after applying the resist underlayer film-forming composition solution prepared in Example 2 onto a hole wafer with a spin coater and baking the applied composition solution at 400° C. for two minutes (the magnification is 100,000 times).
Figure 3:
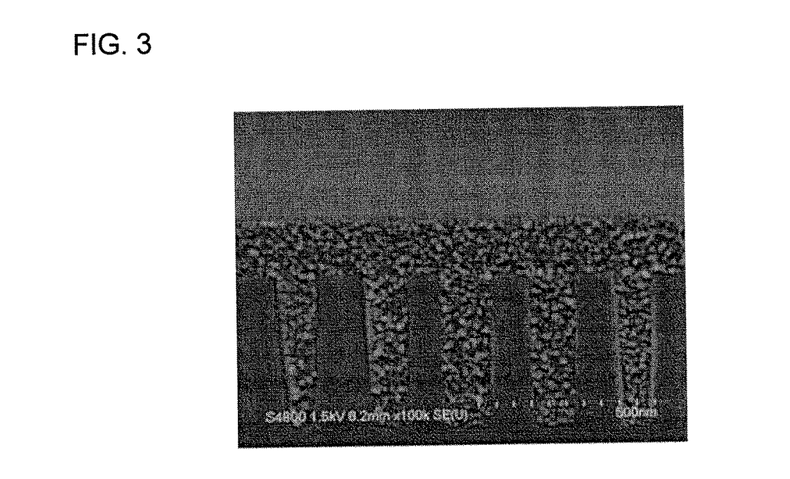
FIG. 3 is a photograph observing with an electron microscope the section of a substrate after applying the resist underlayer film-forming composition solution prepared in Example 3 onto a hole wafer with a spin coater and baking the applied composition solution at 400° C. for two minutes (the magnification is 100,000 times).
Figure 4:
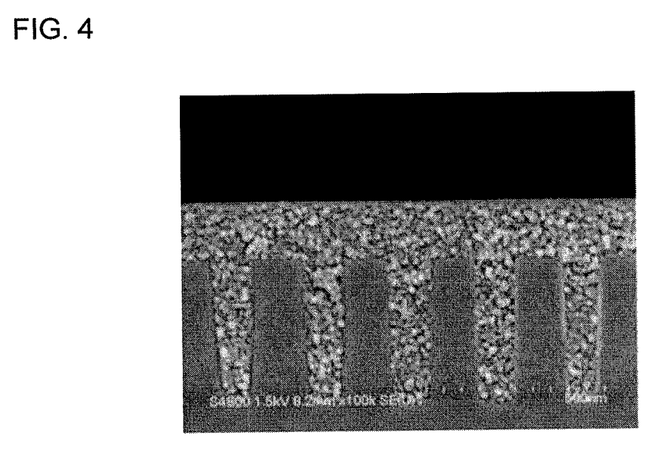
FIG. 4 is a photograph observing with an electron microscope the section of a substrate after applying the resist underlayer film-forming composition solution prepared in Example 4 onto a hole wafer with a spin coater and baking the applied composition solution at 400° C. for two minutes (the magnification is 100,000 times).
Figure 5:
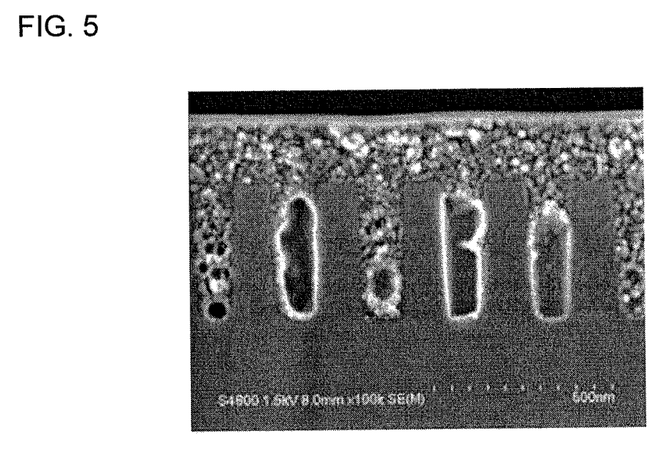
FIG. 5 is a photograph observing with an electron microscope the section of a substrate after applying the resist underlayer film-forming composition solution prepared in Comparative Example 2 onto a hole wafer with a spin coater and baking the applied composition solution at 400° C. for two minutes (the magnification is 100,000 times).

In contrast, from the photograph of FIG. 5 taken by applying the resist underlayer film-forming composition solution prepared in Comparative Example 2 onto the hole wafer with a spin coater, baking the applied composition solution at 400° C. for 2 minutes, thereafter cutting the substrate, and being observed with an electron microscope, cavities, although slightly, partially existed inside the holes.

INDUSTRIAL APPLICABILITY

Unlike conventional high etch rate anti-reflective coatings, the resist underlayer film material of the present invention to be used for a lithography process by a multi-layer film can provide a resist underlayer film having the selectivity of dry etching rate close to or lower than that of the photoresist and the selectivity of dry etching rate lower than that of the semiconductor substrate and also having a function as an anti-reflective coating. The underlayer film material of the present invention also has heat resistance that enables a hard mask to be formed at the upper layer by vapor deposition.

The invention claimed is:

1. A resist underlayer film-forming composition for planarizing a substrate to be used for a lithography process, the resist underlayer film-forming composition comprising:
a novolac polymer obtained by a reaction of an aldehyde compound and an aromatic compound having a secondary amino group, wherein the novolac polymer is a polymer containing a unit structure of Formula (1):

wherein:
R$^1$ is a substituent of a hydrogen atom and is a halogen group, nitro group, amino group, a $C_{1-10}$ alkyl group, a $C_{2-10}$ alkenyl group, a $C_{6-40}$ aryl group, or a combination of these groups optionally containing an ether bond, a ketone bond, or an ester bond;
R$^2$ is a methyl group or a benzyl group;
R$^3$ is a phenyl group, naphthyl group, anthryl group, or pyrenyl group;
R$^4$ is a hydrogen atom;
n is an integer of 0 or 1, and
m is an integer of 0 to 3 when n is 0 and an integer of 0 to 5 when n is 1; and
at least one selected from the group consisting of a rheology modifier, an adhesion assistance agent, and a surfactant.

2. The resist underlayer film-forming composition according to claim 1, wherein n and m are 0.

3. The resist underlayer film-forming composition according to claim 1, further comprising a crosslinking agent.

4. The resist underlayer film-forming composition according to claim 1, further comprising an acid and/or an acid generator.

5. A resist underlayer film obtained by applying the resist underlayer film-forming composition as claimed in claim 1 onto a semiconductor substrate and baking the applied underlayer film-forming composition.

6. A method for producing a semiconductor device, the method comprising the steps of:
forming an underlayer film from the resist underlayer film-forming composition on a semiconductor substrate, the resist underlayer film-forming composition comprising a novolac polymer obtained by a reaction of an aldehyde compound and an aromatic compound having a secondary amino group;
forming a resist film on the underlayer film;
forming a resist pattern by irradiation with light or an electron beam and development;
etching the underlayer film by using the formed resist pattern; and
processing the semiconductor substrate by using the patterned underlayer film.

7. A method for producing a semiconductor device, the method comprising the steps of:
forming a resist underlayer film from the resist underlayer film-forming composition on a semiconductor substrate, the resist underlayer film-forming composition comprising a novolac polymer obtained by a reaction of an aldehyde compound and an aromatic compound having a secondary amino group;
forming a hard mask on the resist underlayer film;
further forming a resist film on the hard mask;
forming a resist pattern by irradiation with light or an electron beam and development;
etching the hard mask by using the formed resist pattern;
etching the resist underlayer film by using the patterned hard mask; and processing the semiconductor substrate by using the patterned underlayer film.

8. The method for producing a semiconductor device according to claim 6, wherein the novolac polymer is a polymer containing a unit structure of Formula (1):

(1)

wherein:
- $R^1$ is a substituent of a hydrogen atom and is a halogen group, nitro group, amino group, a $C_{1-10}$ alkyl group, a $C_{2-10}$ alkenyl group, a $C_{6-40}$ aryl group, or a combination of these groups optionally containing an ether bond, a ketone bond, or an ester bond;
- $R^2$ is a methyl group or a benzyl group;
- $R^3$ is a phenyl group, naphthyl group, anthryl group, or pyrenyl group;
- $R^4$ is a hydrogen atom;
- n is an integer of 0 or 1, and
- m is an integer of 0 to 3 when n is 0 and an integer of 0 to 5 when n is 1.

9. The method for producing a semiconductor device according to claim 7, wherein the novolac polymer is a polymer containing a unit structure of Formula (1):

(1)

wherein:
- $R^1$ is a substituent of a hydrogen atom and is a halogen group, nitro group, amino group, a $C_{1-10}$ alkyl group, a $C_{2-10}$ alkenyl group, a $C_{6-40}$ aryl group, or a combination of these groups optionally containing an ether bond, a ketone bond, or an ester bond;
- $R^2$ is a methyl group or a benzyl group;
- $R^3$ is a phenyl group, naphthyl group, anthryl group, or pyrenyl group;
- $R^4$ is a hydrogen atom;
- n is an integer of 0 or 1, and
- m is an integer of 0 to 3 when n is 0 and an integer of 0 to 5 when n is 1.

10. The resist underlayer film-forming composition according to claim 1, further comprising an additional polymer selected from the group consisting of polyacrylate compounds, polymethacrylate compounds, polyacrylamide compounds, polymethacrylamide compounds, polyvinyl compounds, polystyrene compounds, polymaleimide compounds, polymaleic anhydrides, and polyacrylonitrile compounds.

* * * * *